United States Patent
Wang et al.

(10) Patent No.: US 9,449,891 B1
(45) Date of Patent: Sep. 20, 2016

(54) PROXIMITY SWITCH FABRICATION METHOD USING ANGLED DEPOSITION

(71) Applicant: The United States of America as represented by the Secretary of the Navy, Washington, DC (US)

(72) Inventors: Andrew Wang, San Diego, CA (US); Paul D. Swanson, San Diego, CA (US); Charles H. Tally, IV, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 0 days.

(21) Appl. No.: 14/631,344

(22) Filed: Feb. 25, 2015

(51) Int. Cl.
*H01L 21/306* (2006.01)
*H01L 21/283* (2006.01)
*H01L 21/66* (2006.01)
*H01L 21/78* (2006.01)

(52) U.S. Cl.
CPC ............. *H01L 22/14* (2013.01); *H01L 21/283* (2013.01); *H01L 21/306* (2013.01); *H01L 21/78* (2013.01)

(58) Field of Classification Search
CPC .... H01L 22/14; H01L 21/283; H01L 21/306
USPC .......................................................... 438/17
See application file for complete search history.

(56) References Cited

U.S. PATENT DOCUMENTS

| | | | |
|---|---|---|---|
| 7,250,115 B2 | 7/2007 | Barth | |
| 8,991,250 B2 * | 3/2015 | Waters | G01C 19/5607 73/504.16 |
| 2002/0084791 A1 * | 7/2002 | Klehn | G01R 1/06755 324/754.21 |
| 2002/0150319 A1 * | 10/2002 | Antaki | G02B 6/30 385/14 |
| 2003/0015698 A1 * | 1/2003 | Baldo | H01L 27/28 257/40 |
| 2010/0097059 A1 * | 4/2010 | Estrada | G01R 33/0005 324/251 |
| 2011/0247933 A1 * | 10/2011 | Rothberg | C12Q 1/6869 204/406 |
| 2012/0326700 A1 * | 12/2012 | Swanson | G01P 15/097 324/76.11 |
| 2013/0111990 A1 * | 5/2013 | Wang | G01C 19/5776 73/504.12 |
| 2013/0294729 A1 * | 11/2013 | Layton | B82Y 20/00 385/40 |

OTHER PUBLICATIONS

Zhao, Y.P. et al., "Designing Nanostructures by Glancing Angle Deposition", Proceedings of SPIE, vol. 5219, Nanotubes and Nanowires, SPIE, 2003, pp. 59-73.

* cited by examiner

*Primary Examiner* — Moazzam Hossain
(74) *Attorney, Agent, or Firm* — SPAWAR Systems Center Pacific; Kyle Eppele; Ryan J. Friedl

(57) ABSTRACT

A method involves applying a voltage to a first conductive surface and a second conductive surface separated by a conductive surface gap of a distance greater than the distance required to produce a tunneling current between the first and second conductive surfaces when the voltage is applied, and using angled deposition to deposit conductive material on the first and second conductive surfaces to narrow the conductive surface gap until a tunneling current appears across the first and second conductive surfaces responsive to the applied voltage.

14 Claims, 7 Drawing Sheets

PROXIMITY SWITCH FABRICATION METHOD USING ANGLED DEPOSITION

FEDERALLY SPONSORED RESEARCH AND DEVELOPMENT

The Proximity Switch Fabrication Method Using Angled Deposition is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102181.

BACKGROUND

Accurate measurements of parameters, such as force, are often required in a wide variety of applications. Microelectromechanical sensors (MEMS) devices, such as accelerometers, have been extensively used in dynamic distance and speed measurements, inclination, machine vibration, buildings and structural monitoring, component placement in manufacturing, process control systems and safety installations. Angular rotation rate MEMS, also referred to as the gyroscope or the rate sensors, are useful in areas such as navigation, automotive (e.g., electronic stability control), entertainment (e.g., user motion detection for game consoles), photography (e.g., image stabilization), animal behavior studies, and many other applications. Pressure sensors are similarly widely used in applications such as weather, industrial monitoring and control, aircraft and automotive, oil and gas exploration, flow sensing, acoustics, etc. Many other parameter measurement applications exist, such as magnetic force measurements used in navigation and mineral exploration or electrostatic force measurements used in microscopy, etc.

Recent advancements have allowed for increased sensitivity in accelerometers using time domain measurements of oscillation perturbations by exploiting post processing of time domain data. However, the fabrication of such devices has been problematic because the proximity required to produce a tunneling event presents fabrication challenges such as low yield and long processing involving multiple focused ion beam cuts. Accordingly, it is desirable for an improved fabrication method for a proximity switch that may be used in such devices.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Figure 1:
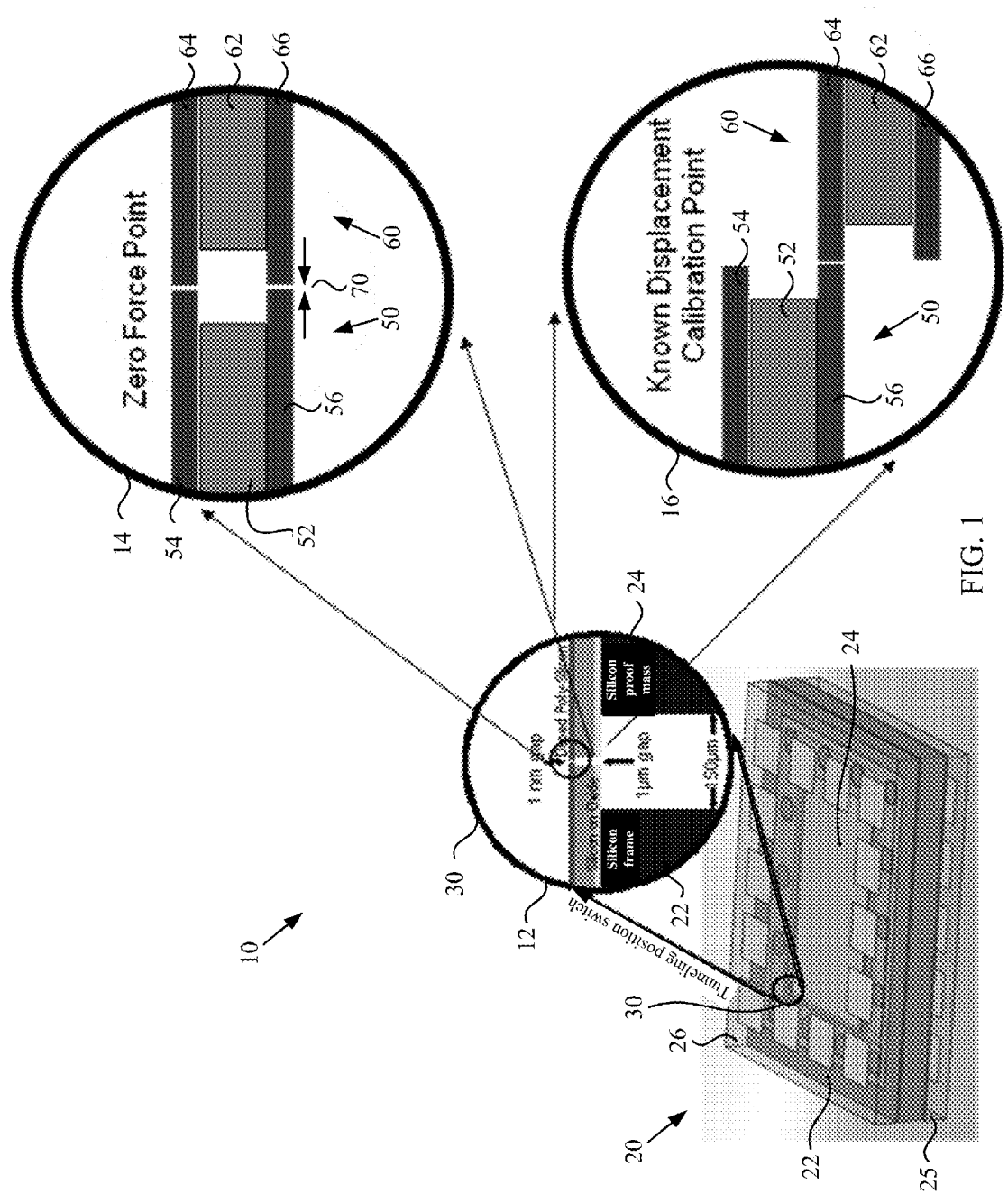
FIG. 1 shows a diagram illustrating the operation of a time domain inertial sensor using a proximity switch that may be produced in accordance with the Proximity Switch Fabrication Method Using Angled Deposition.

FIG. 1 shows a diagram 10 illustrating the operation of a time domain inertial sensor 20 using a proximity switch that may be produced in accordance with the Proximity Switch Fabrication Method Using Angled Deposition. Sensor 20 comprises a frame 22 and a cantilevered proof mass assembly 24 sealed between a base 25 and a capping wafer 26 using, in one variant, a gold thermo-compression wafer bonding technique. However, many other fabrication methods may be used, including but not limited to gold-tin eutectics or other eutectics, glass-fit bonding, fusion bonding, electrostatic bonding, etc.

Frame 22 and proof mass assembly 24 each comprise an electron tunneling electrode assembly, which together form a digital switch structure 30 shown in the inset (magnified view) 12. The switch structure is in this embodiment formed by one or more pairs of opposing electron tunneling electrodes, such as the reference electrode assembly 50 disposed on frame 22 and the sensing electrode assembly 60, disposed on the proof mass assembly 24, as shown in the inset 14.

In the absence of external forcing (zero force state), the top electrode 54 of assembly 50 is configured to be aligned with the top electrode 64 of assembly 60. Bottom electrode 56 is configured to be aligned with bottom electrode 66, as shown in inset 14. With external forcing, as an example, bottom electrode 56 may become temporarily aligned with top electrode 64, as shown in inset 16, as proof mass assembly 24 oscillates with respect to frame 22. The distance between the zero force point shown in inset 14 and the known displacement calibration point shown in inset 16 may be used to determine parameters of the oscillation of proof mass assembly 24, including the parameters of the external forcing.

Electrodes 54, 56, 64, and 66 may comprise a layer of conductive material (such as e.g., doped poly-silicon, or a thin metallization such as platinum, chromium, aluminum, tungsten, gold, etc.) separated by an insulating layer 52 and 62, respectively (such as e.g., silicon oxide, or silicon on insulator), disposed in-between, as shown. Reference electrode assembly 50 is disposed on the bulk silicon element of frame 22, and sensing electrode assembly 60 is disposed on the bulk silicon element of proof mass assembly 24. As will be appreciated by those skilled in the art, a wide variety of other electrode assembly configurations exist which may be used consistent with the disclosure herein, including for example electrodes 54, 56, 64, and 66 of different thickness, material, position, and/or shape.

At the zero force position, electrode pairs 54, 64 and 56, 66 are aligned horizontally and separated by a narrow gap. In the embodiment shown, the gap 70 is on the order of 1 nanometer (nm) in width. In one variant, the gap is selected to fall in the range from about 1 nm to about 50 nm; however, other values may be substituted. The close proximity of the electrodes within each electrode pair 54, 64 and 56, 66 causes an electron tunneling discharge across the gap. Tunneling devices take advantage of the relationship between tunneling current and tip-to-surface distance in order to measure the proof mass deflection. When a DC voltage bias is applied between tip and surface, a tunneling current of about 1 nano-ampere (nA) can be measured. Small variations (e.g. 1 Angstrom) in the tip-surface separation appear as large variations (e.g., 10-80%) in the tunneling current.

To create a tunneling switch, the tunneling electrodes of the opposing switch sides are subjected to different electric potentials. That is, tunneling electrodes 54 and 56 of reference electrode assembly 50 are subjected to a DC potential (DC charge) that is different from the DC potential of the respective electrodes 64 and 66 of sensing electrode assembly 60. In one variant, electrodes 64 and 66 are grounded (zero potential), and electrodes 54 and 56 are charged to a specific positive voltage, for example 30 V. Typically, voltage difference across the electrodes is less that 50 V, which is sufficient to produce a pulse of current across gap 70 in the range between 1 nm and 50 nm.

The difference in the electrode potentials forms a charged electrode tip pair. Whenever these charged tips pass through the reference position (such as, the zero force point), a high electric field region is temporarily formed between the charged tips, causing an electric discharge across gap 70. The corresponding tunneling currents induced in the electrodes 54, 56, 64, and 66 act as precise indicators of the electrode tip alignment, thus serving as the mechanism for measuring external forcing. The magnitude of external forcing can be estimated using a variety of methods. For instance, in one embodiment, the force is computed by dividing the resonant frequency period of the proof mass by the measured time between the pulses, corresponding to the zero force point.

It is noted that in the embodiment of the inertial sensing apparatus shown in FIG. 1, the tunneling effect is only used as the trigger mechanism (generating a tunneling current when the electrode pairs 54, 64 and 64, 66 are aligned) in order to indicate when the oscillating proof mass passes through the trigger points. Other approaches may be used as well.

Proof mass assembly 24, and therefore, sensing electrode assembly 60 are configured to oscillate in a direction that is substantially perpendicular to the plane of sensor 20. The illustrated electrode configuration of FIG. 1 advantageously allows for much a wider separation between the electrode tips (1 nm vs. 1-10 Angstrom), as the device does not need to measure the actual distance between the electrode tips. A wider gap further prevents accidental tip-to-tip contact, thereby increasing robustness and longevity of the device. Moreover, such an electrode configuration does not limit electrode displacement to the Angstrom-level, thereby greatly increasing the dynamic range (and utility) of the inertial sensing device.

Further, no feedback loop closures of any kind are required for proper operation of the device. The larger surface area of the electrodes 54, 56, 64, and 66, which is primarily due to a larger lateral extent of the conductive layers, advantageously results in a larger tunneling current as compared to typical scanning electron microscopes, which generally use a needle-type sensing electrode. Because the tunneling mechanism is used as a switch in the sensing apparatus of FIG. 1, it is also impervious to tunneling tip degradation, provided that the tunneling current remains above the noise floor of the front-end amplifier, which is $3 \times 10^{-15}$ A in one exemplary variant.

Depending on the specific sensor application requirements of the sensing application, the forcing frequency may be in the range from about 100 Hz to about 200 kHz. The corresponding maximum amplitude of the proof mass oscillations is between about 10 nm and about 50 µm. The size of the exemplary sensing device 20 is selected based on various specification or operational parameters including, but not limited to, resonant frequency, thermal noise floor, sensor dynamic range, power consumption, configuration (e.g., one axis, two axes), and cost. In one embodiment, the proof mass assembly is between 50 µm and 500 µm in width, and between 100 µm and 9 mm in length. The sensor frame is constructed to be sufficiently large to house the proof mass while allowing for wafer level bonding and electrical interconnects (typically requiring additional 100-500 µm around the perimeter of the proof mass). Notwithstanding, it will be appreciated by those skilled in the art that the above dimensions are merely exemplary and the sensing device could be made larger or smaller as required by the application or other considerations.

Figure 2A:
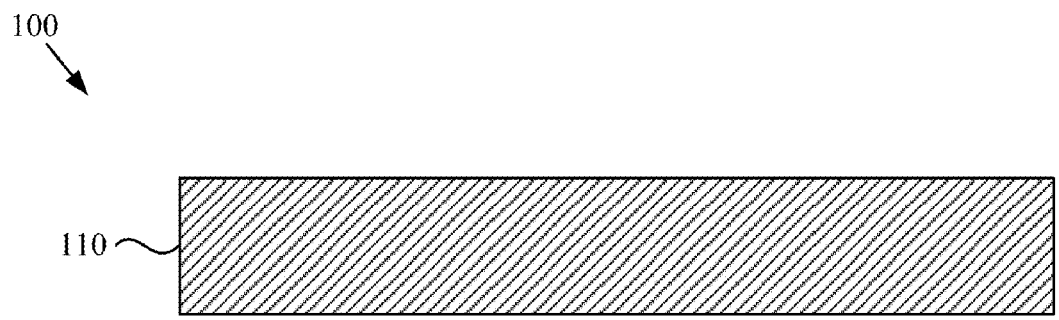
FIGS. 2A-2I show diagrams illustrating an embodiment of a system fabricated in accordance with the Proximity Switch Fabrication Method Using Angled Deposition.
Figure 2B:
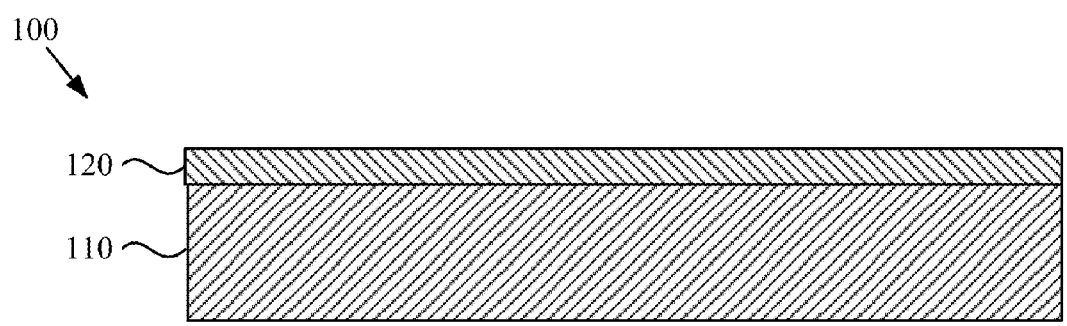

FIGS. 2A-2I show diagrams illustrating an embodiment of system 100 fabricated in accordance with the Proximity Switch Fabrication Method Using Angled Deposition. As shown in FIG. 2A, system 100 begins with a substrate 110. As an example, substrate 110 may comprise a wafer of silicon or other semiconductor material as would be recognized by one having ordinary skill in the art. In FIG. 2B, an insulator layer 120 has been applied to substrate 110. As an example, insulator layer 120 may comprise a silicon oxide layer applied using a deposition process.

Figure 2C:
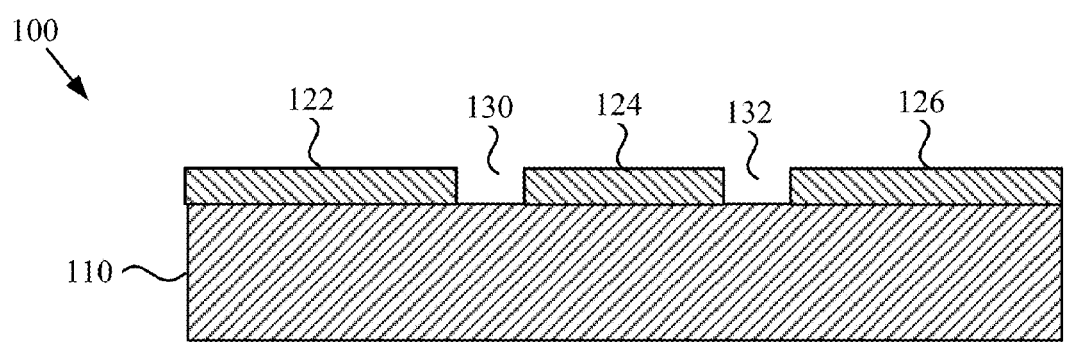

In FIG. 2C, insulator layer gaps 130 and 132 are created in insulator layer 120, separating insulator layer 120 into three insulator layer sections—first insulator layer section 122 separated from second insulator layer section 124 by insulator layer gap 130, and third insulator layer section 126 separated from second insulator layer section 124 by insulator layer gap 132. As an example, insulator layer gaps 130 and 132 are created using electron beam lithography.

Figure 2D:
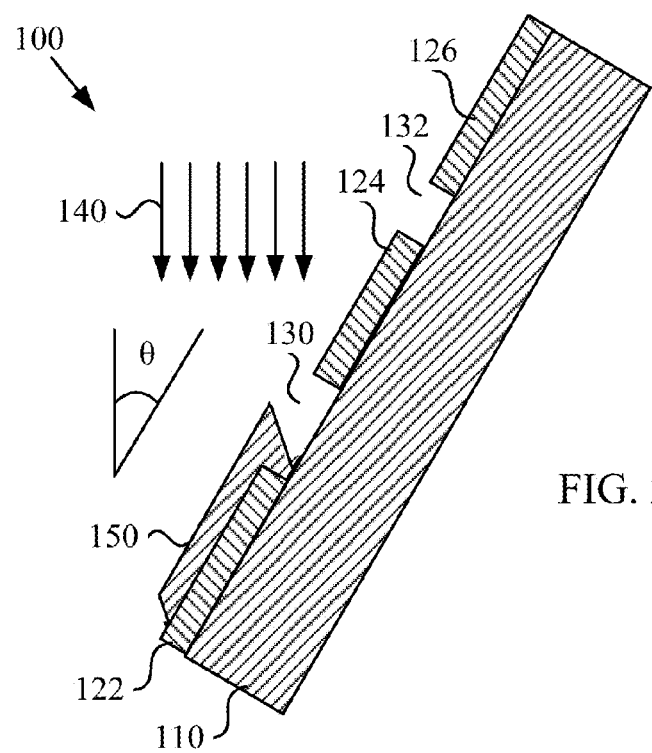

In some embodiments, the width of gaps 130 and 132 are greater than the distance required to produce a tunneling current responsive to a voltage applied to a thin first metal layer 150 applied to first insulator layer section 122 and a thin first metal layer 152 applied to second insulator layer section 124 (see FIG. 2D).

As shown in FIG. 2D, substrate 110 has been rotated about an axis until the first insulator layer section 122 is at a first angle θ with respect to a deposition source 140. As an example, angle θ is less than 90°. In some embodiments, angle θ is determined according to:

$$\theta > 90° - \arctan\left(\frac{\text{resist thickness}}{\text{gap length}}\right) \quad \text{(Eq. 1)}$$

As an example, using an 80 nm resist with a 110 nm gap, angle θ>54°, so for example, 60° may be chosen. It should be realized, however, that other methods for determining the angle of rotation for substrate 110 may be used and fall within the scope of the embodiments of the method disclosed herein.

A first metal layer 150 has been deposited over at least a portion of first insulator layer section 122 proximate to the insulator layer gap 130, wherein an edge of first metal layer 150 over first insulator layer section 122 angles downward from a distal end towards substrate 110.

Figure 2E:
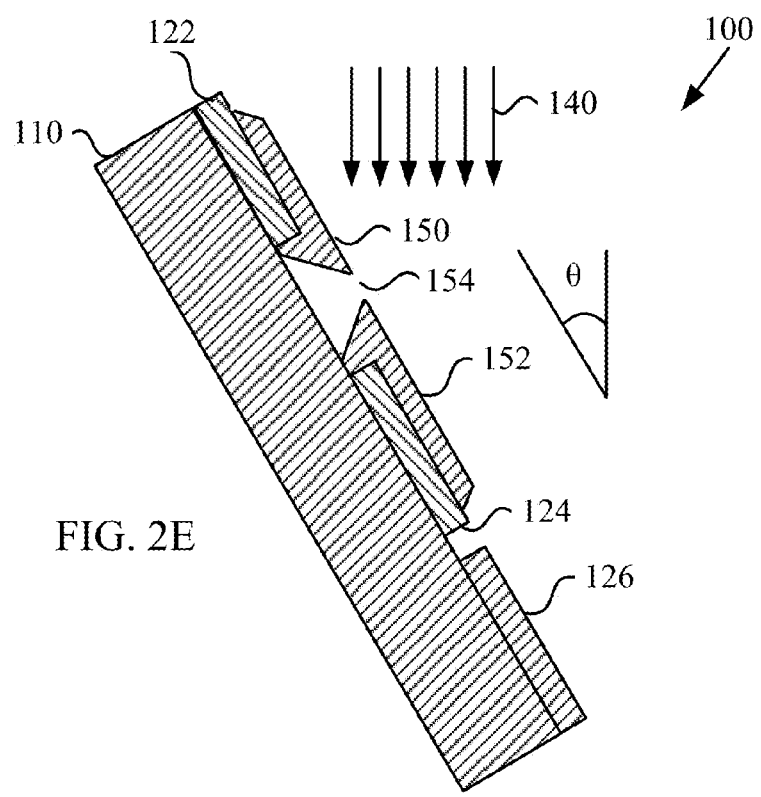

As shown in FIG. 2E, substrate 110 has been rotated about an axis until the second insulator layer section 124 is at a second angle with respect to deposition source 140. In some embodiments, the second angle is equal to the first angle, but in the opposite direction. However, the first angle and the second angle need not be symmetric, nor the same. A first metal layer 152 has been deposited over at least a portion of second insulator layer section 124 proximate to the insulator layer gap 130, wherein an edge of first metal layer 152 over second insulator layer section 124 angles downward from a distal end towards substrate 110. A metal layer gap 154 is formed between the edge of first metal layer 150 over first insulator layer section 122 and the edge of first metal layer 152 over second insulator layer section 124.

In some embodiments, the deposition process performed as shown in FIGS. 2D and 2E may be performed by depositing a thin initial layer of conductive material on insulator layer sections 122 and 124, then applying a voltage to the layer of conductive material on each insulator layer section 122 and 124. Angled deposition, such as by rotating the substrate as describe above, then is used to deposit more conductive material on the thin initial layers of conductive material to narrow the gap between the conductive surfaces until a tunneling current appears across the conductive surfaces. The deposition stops when a tunneling current is detected.

In some embodiments, the tunneling current across the conductive surfaces is measured using a scanning electron microscope. In some embodiments, the tunneling current is measured using probes. In some embodiments where the deposition is occurring in a vacuum chamber, electrical connections may be run out of the chamber so that the tunneling current can be measured without breaking vacuum.

Figure 2F:
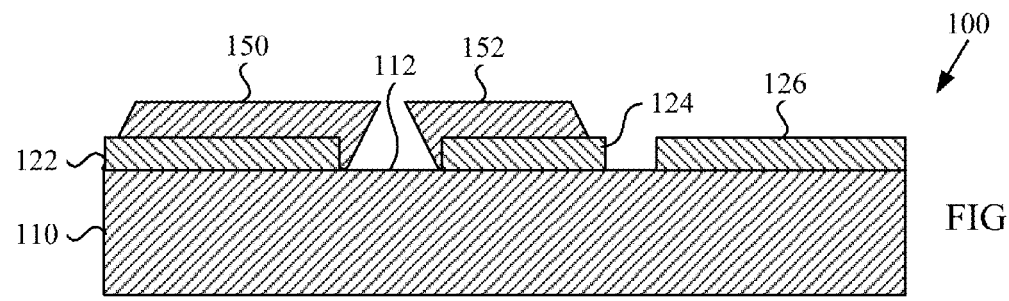
Figure 2G:
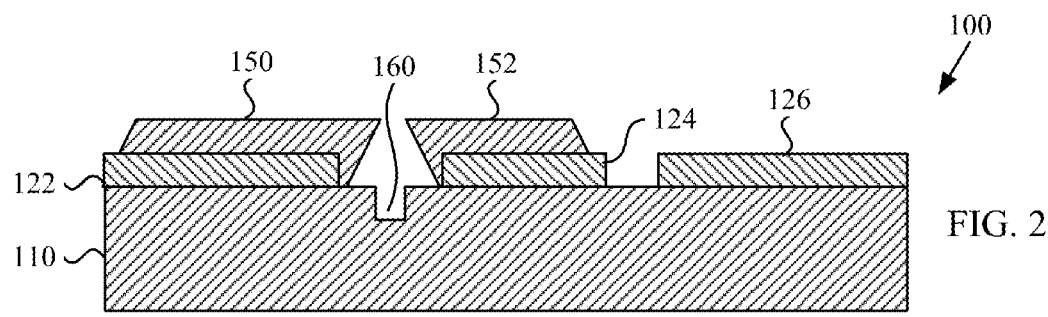

FIG. 2F shows the result of the angled deposition steps. As shown, the exposed portion 112 of substrate 110 between first insulator layer section 122 and second insulator layer section 124 remains substantially exposed. FIG. 2G shows a substrate gap 160 that has been etched into a portion of substrate 110 within the exposed portion 112 of substrate 110. Substrate gap 160 may be used to prevent shorting of the electrode tips (e.g. tips of metal layers 150 and 152) during deposition.

Figure 2H:
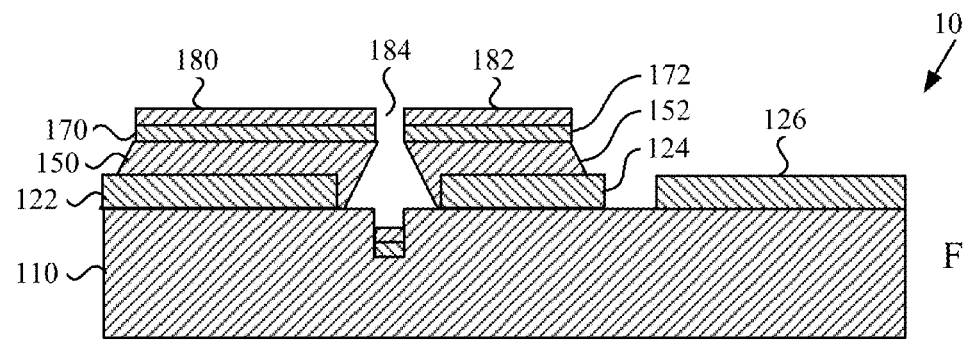

FIG. 2H shows the result of steps including depositing a second insulator layer 170 over first metal layer 150 on first insulator layer section 122, depositing a second insulator layer 172 over first metal layer 152 on second insulator layer section 124, depositing a second metal layer 180 over second insulator layer 170 on first insulator layer section 122, and depositing a second metal layer 182 over second insulator layer 172 on second insulator layer section 124.

A second metal layer gap 184 has been formed between the edge of second metal layer 180 on first insulator layer section 122 and the edge of second metal layer 182 over second insulator layer section 124. As an example, second metal layer gap 184 is about 1 nm. The exposed portion 112 of substrate 110 remains substantially exposed, via gap 160, which now includes an insulator layer and a metal layer resulting from the above depositions.

Figure 2I:
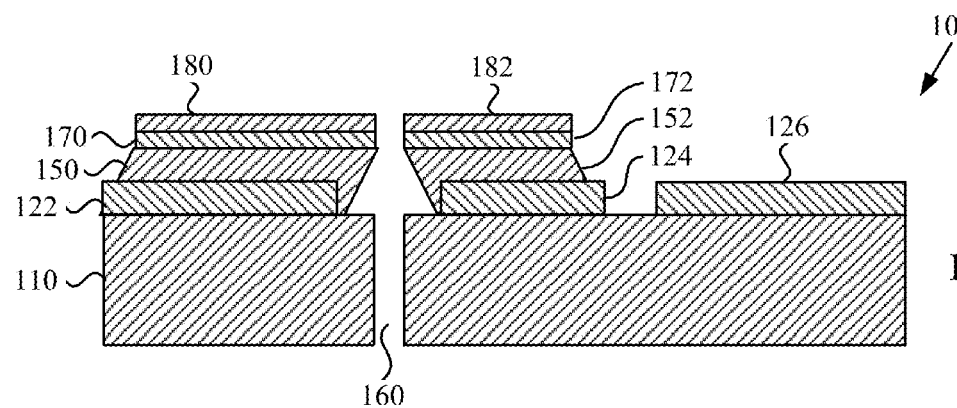

FIG. 2I shows the result of the step of etching through substrate gap 160 to separate substrate 110 into two sections that are movable with respect to one another. In some embodiments, the etching through substrate gap 160 is performed from the side of the substrate not containing first insulating layer 120. As such, the etching as shown was performed from the bottom side of substrate 110.

As an example, first metal layer 150, second insulator layer 170, and second metal layer 180 may correspond to electrode 56, insulator layer 52, and electrode 54, respectively, as shown in FIG. 1. Further, first metal layer 152, second insulator layer 172, and second metal layer 182 may correspond to electrode 66, insulator layer 62, and electrode 64, respectively, as shown in FIG. 1. Further, separated substrate 110 may correspond to frame portion 22 and proof mass 24 separated by a gap as shown in FIG. 1.

Figure 3:
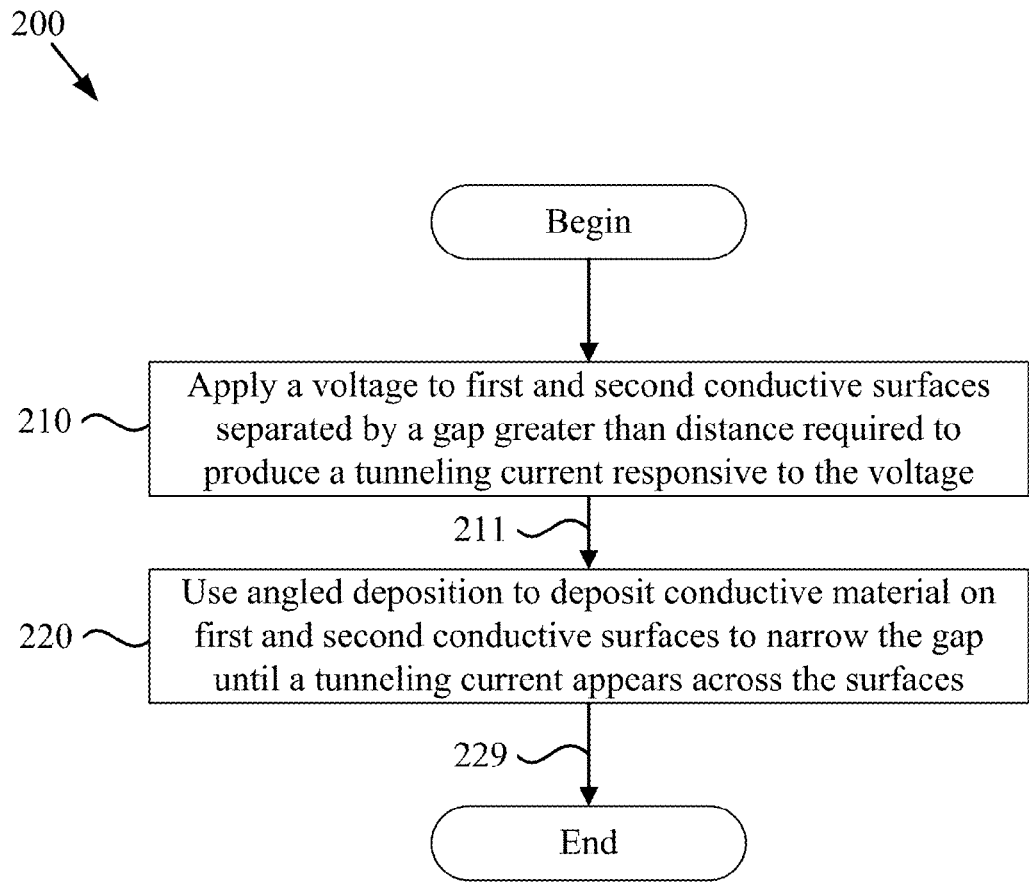
FIG. 3 shows a flowchart of an embodiment of a method in accordance with the Proximity Switch Fabrication Method Using Angled Deposition.

FIG. 3 shows a flowchart of an embodiment of a method 200 in accordance with the Proximity Switch Fabrication Method Using Angled Deposition. For illustrative purposes, method 200 will be discussed with reference to system 100 as shown in FIGS. 2A-2I. Additionally, while FIG. 3 shows one embodiment of method 200 to include steps 210-220, other embodiments of method 200 may contain fewer or more steps. Further, while in some embodiments the steps of method 200 may be performed as shown in FIG. 3, in other embodiments the steps may be performed in a different order, or certain steps may occur simultaneously with one or more other steps.

Method 200 begins at step 210, which involves applying a voltage to a first conductive surface 150 and a second conductive surface 152 separated by a conductive surface gap 154 of a distance greater than the distance required to produce a tunneling current between the first and second conductive surfaces 150 and 152, respectively, when the voltage is applied. Method 200 then follows flow path 211 to step 220, discussed in more detail with regard to FIG. 4, which involves using angled deposition to deposit conductive material on the first and second conductive surfaces 150 and 152, respectively, to narrow the conductive surface gap 154 until a tunneling current appears across the first and second conductive surfaces 150 and 152, respectively, responsive to the applied voltage.

Figure 4:
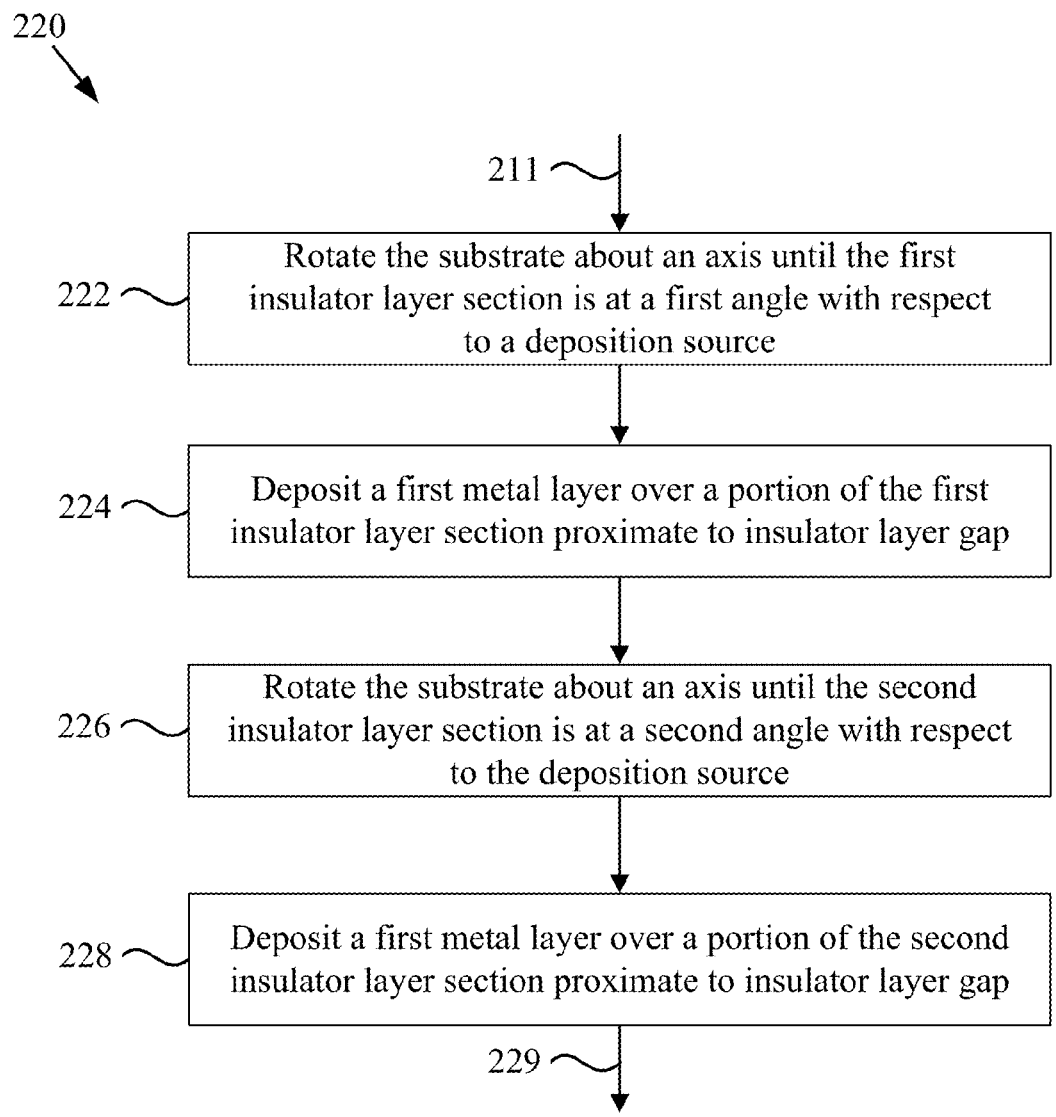
FIG. 4 shows a flowchart of an embodiment of a step for using angled deposition to deposit conductive material on first and second conductive surfaces in accordance with the Proximity Switch Fabrication Method Using Angled Deposition.

FIG. 4 shows a flowchart of an embodiment of step 220 shown in FIG. 3. Step 222 involves rotating the substrate 110 about an axis until the first insulator layer section 122 is at a first angle θ with respect to a deposition source 140. Step 224 involves depositing a first metal layer 150 over at least a portion of first insulator layer section 122 proximate to insulator layer gap 130, wherein an edge of the first metal layer 150 over first insulator layer section 122 angles downward from a distal end towards substrate 110.

Step 226 involves rotating substrate 110 about the axis until second insulator layer section 124 is at a second angle with respect to deposition source 140. In some embodiments, the second angle is equal to the first angle, but in the opposite direction. However, the first angle and the second angle need not be symmetric, nor the same.

Step 228 involves depositing a first metal layer 152 over at least a portion of the second insulator layer section 124 proximate to insulator layer gap 130, wherein an edge of first metal layer 152 over second insulator layer section 124 angles downward from a distal end towards substrate 110. A metal layer gap 154 is formed between the edge of first metal layer 150 over first insulator layer section 122 and the edge of first metal layer 152 over second insulator layer section 124. The exposed portion 112 of substrate 110 between first insulator layer section 122 and second insulator layer section 124 remains substantially exposed. Method 200 may then proceed along flow path 229 to termination.

Figure 5:
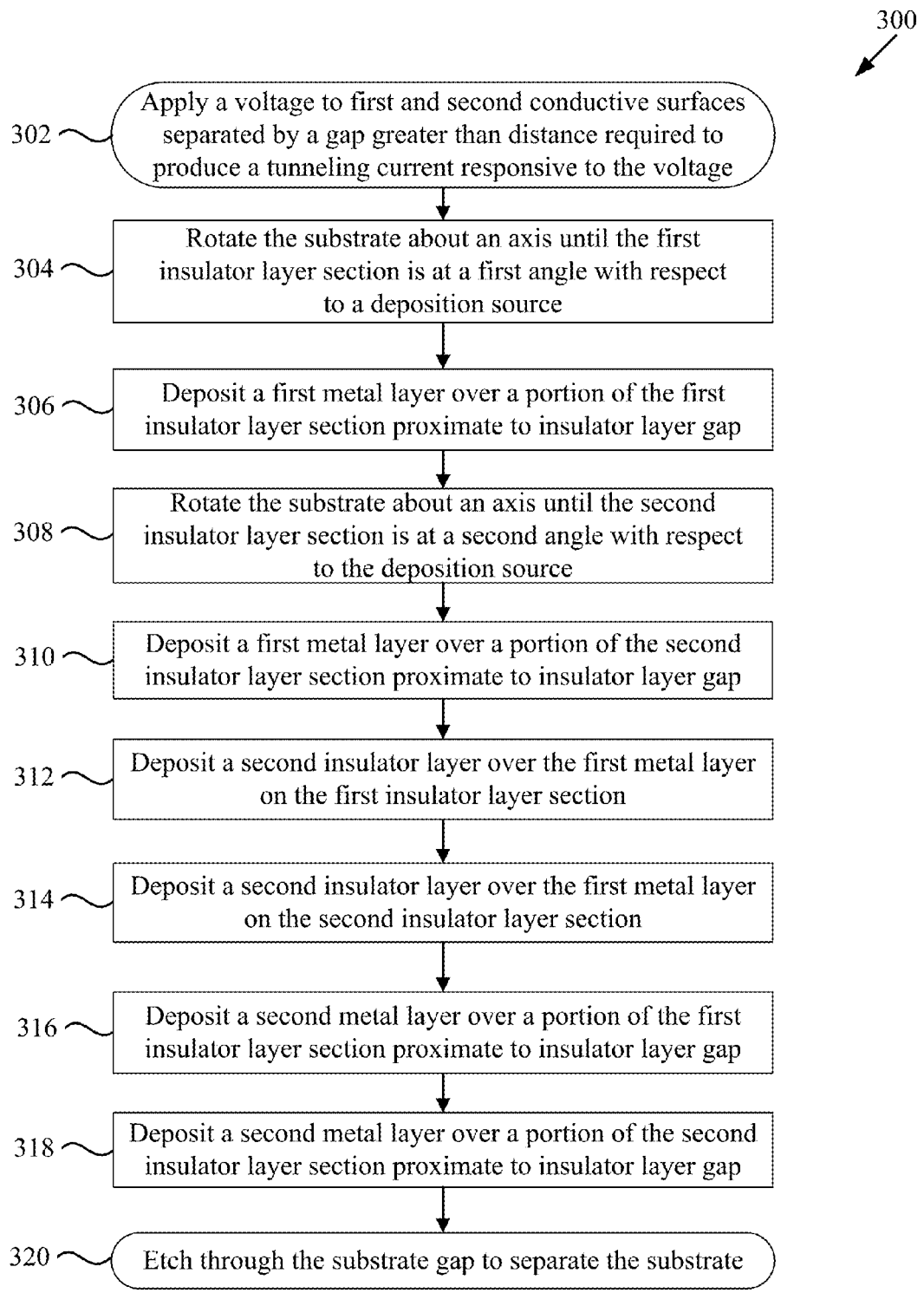
FIG. 5 shows a flowchart of an embodiment of a method in accordance with the Proximity Switch Fabrication Method Using Angled Deposition.

FIG. 5 shows a flowchart of an embodiment of a method 300 in accordance with the Proximity Switch Fabrication Method Using Angled Deposition. For illustrative purposes, method 300 will be discussed with reference to system 100 as shown in FIGS. 2A-2I. Additionally, while FIG. 5 shows one embodiment of method 300 to include steps 302-320, other embodiments of method 300 may contain fewer or more steps. Further, while in some embodiments the steps of method 300 may be performed as shown in FIG. 5, in other embodiments the steps may be performed in a different order, or certain steps may occur simultaneously with one or more other steps.

Method 300 begins at step 302, which involves applying a voltage to a first conductive surface 150 and a second conductive surface 152 separated by a conductive surface gap 154 of a distance greater than the distance required to produce a tunneling current between the first and second conductive surfaces 150 and 152, respectively, when the voltage is applied. Step 304 involves rotating the substrate 110 about an axis until the first insulator layer section 122 is at a first angle θ with respect to a deposition source 140. Step 306 involves depositing a first metal layer 150 over at least a portion of first insulator layer section 122 proximate to insulator layer gap 130, wherein an edge of the first metal layer 150 over first insulator layer section 122 angles downward from a distal end towards substrate 110.

Step 308 involves rotating substrate 110 about the axis until second insulator layer section 124 is at a second angle with respect to deposition source 140. In some embodiments, the second angle is equal to the first angle, but in the opposite direction. However, the first angle and the second angle need not be symmetric, nor the same. Step 310 involves depositing a first metal layer 152 over at least a portion of the second insulator layer section 124 proximate to insulator layer gap 130, wherein an edge of first metal layer 152 over second insulator layer section 124 angles downward from a distal end towards substrate 110. A metal layer gap 154 is formed between the edge of first metal layer 150 over first insulator layer section 122 and the edge of first metal layer 152 over second insulator layer section 124. The exposed portion 112 of substrate 110 between first insulator layer section 122 and second insulator layer section 124 remains substantially exposed.

Step 312 involves depositing a second insulator layer 170 over first metal layer 150 on first insulator layer section 122. Step 314 involves depositing a second insulator layer 172 over first metal layer 152 on second insulator layer section 124. Step 316 involves depositing a second metal layer 180 over second insulator layer 170 on first insulator layer section 122. Step 318 involves depositing a second metal layer 182 over second insulator layer 172 on second insulator layer section 124, forming a second metal layer gap 184 between the edge of second metal layer 180 on first insulator layer section 122 and the edge of second metal layer 182 over second insulator layer section 124. The exposed portion 112 of substrate 110 remains substantially exposed, via gap 160.

Method 300 then proceeds to step 320, which involves etching through substrate gap 160 to separate substrate 110 into two sections that are movable with respect to one another. In some embodiments, the etching through substrate gap 160 is performed from the side of the substrate not containing first insulating layer 120. As shown in FIG. 2I, the etching is performed from the bottom of substrate 110.

Many modifications and variations of the Proximity Switch Fabrication Method Using Angled Deposition are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A method comprising the steps of:
applying a voltage of less than 50V to a first conductive surface and a second conductive surface separated by a conductive surface gap of a distance greater than the distance required to produce a tunneling current between the first and second conductive surfaces when the voltage is applied, wherein the first conductive surface is disposed on a first insulator layer section disposed on a substrate and the second conductive surface is disposed on a second insulator layer section disposed on the substrate, wherein the first insulator layer section and the second insulator layer section are separated by an insulator layer gap aligned with the conductive surface gap, wherein the insulator layer gap exposes a portion of the substrate; and
using angled deposition to deposit conductive material on the first and second conductive surfaces to narrow the conductive surface gap until a tunneling current appears across the first and second conductive surfaces responsive to the applied voltage, wherein the width of the conductive surface gap when the tunneling current appears is between 1 nm and 50 nm, wherein the step comprises rotating the substrate about an axis until the first insulator layer section is at a first angle with respect to a deposition source, depositing a first metal layer over at least a portion of the first insulator layer section proximate to the insulator layer gap, wherein an edge of the first metal layer over the first insulator layer section angles downward from a distal end towards the substrate, rotating the substrate about the axis until the second insulator layer section is at a second angle with respect to the deposition source, and depositing a first metal layer over at least a portion of the second insulator layer section proximate to the insulator layer gap, wherein an edge of the first metal layer over the second insulator layer section angles downward from a distal end towards the substrate, wherein a metal layer gap is formed between the edge of the first metal layer over the first insulator layer section and the edge of the first metal layer over the second insulator layer section, wherein the exposed portion of the substrate remains substantially exposed.

2. The method of claim 1, wherein the first angle is equal to the second angle.

3. The method of claim 1 further comprising the step of etching a substrate gap into a portion of the substrate within the exposed portion of the substrate.

4. The method of claim 3 further comprising the steps of:
   depositing a second insulator layer over the first metal layer on the first insulator layer section;
   depositing a second insulator layer over the first metal layer on the second insulator layer section;
   depositing a second metal layer over the second insulator layer on the first insulator layer section; and
   depositing a second metal layer over the second insulator layer on the second insulator layer section, wherein a second metal layer gap is formed between the edge of the second metal layer on the first insulator layer section and the edge of the second metal layer over the second insulator layer section, wherein the exposed portion of the substrate remains substantially exposed.

5. The method of claim 4, wherein the second metal layer gap is about 1 nm.

6. The method of claim 4 further comprising the step of etching through the substrate gap to separate the substrate.

7. The method of claim 6, wherein the step of etching through the substrate gap is performed from the side of the substrate not containing the first insulating layer.

8. The method of claim 1, wherein the substrate comprises silicon.

9. The method of claim 1, wherein the tunneling current is measured using a scanning electron microscope.

10. A method comprising the steps of:
    applying a voltage of less than 50V to a first conductive surface and a second conductive surface separated by a conductive surface gap of a distance greater than the distance required to produce a tunneling current between the first and second conductive surfaces when the voltage is applied, wherein the first conductive surface is disposed on a first insulator layer section disposed on a substrate and the second conductive surface is disposed on a second insulator layer section disposed on the substrate, wherein the first insulator layer section and the second insulator layer section are separated by an insulator layer gap aligned with the conductive surface gap, wherein the insulator layer gap exposes a portion of the substrate;
    depositing conductive material on the first and second conductive surfaces to narrow the conductive surface gap until a tunneling current appears across the first and second conductive surfaces responsive to the applied voltage, wherein the width of the conductive surface gap when the tunneling current appears is between 1 nm and 50 nm, wherein the step of depositing comprising rotating the substrate about an axis until the first insulator layer section is at a first angle with respect to a deposition source, depositing a first metal layer over at least a portion of the first insulator layer section proximate to the insulator layer gap, wherein an edge of the first metal layer over the first insulator layer section angles downward from a distal end towards the substrate, rotating the substrate about an axis until the second insulator layer section is at a second angle with respect to the deposition source, and depositing a first metal layer over at least a portion of the second insulator layer section proximate to the insulator layer gap, wherein an edge of the first metal layer over the second insulator layer section angles downward from a distal end towards the substrate, wherein a metal layer gap is formed between the edge of the first metal layer over the first insulator layer section and the edge of the first metal layer over the second insulator layer section, wherein the exposed portion of the substrate remains substantially exposed;
    etching a substrate gap into a portion of the substrate within the exposed portion of the substrate; and
    etching through the substrate gap to separate the substrate.

11. The method of claim 10, wherein the step of etching through the substrate gap is performed from the side of the substrate not containing the first insulating layer.

12. The method of claim 10, wherein the substrate comprises silicon.

13. The method of claim 10, wherein the first angle is equal to the second angle.

14. The method of claim 10, wherein the tunneling current is measured using a scanning electron microscope.

* * * * *